United States Patent
Basol

(10) Patent No.: US 7,091,136 B2
(45) Date of Patent: Aug. 15, 2006

(54) METHOD OF FORMING SEMICONDUCTOR COMPOUND FILM FOR FABRICATION OF ELECTRONIC DEVICE AND FILM PRODUCED BY SAME

(76) Inventor: Bulent M. Basol, 3001 Maple Ave., Manhattan Beach, CA (US) 90266

( * ) Notice: Subject to any disclaimer, the term of this patent is extended or adjusted under 35 U.S.C. 154(b) by 53 days.

(21) Appl. No.: 10/474,259

(22) PCT Filed: Apr. 11, 2002

(86) PCT No.: PCT/US02/11047

§ 371 (c)(1),
(2), (4) Date: May 19, 2004

(87) PCT Pub. No.: WO02/084708

PCT Pub. Date: Oct. 24, 2002

(65) Prior Publication Data

US 2004/0219730 A1    Nov. 4, 2004

Related U.S. Application Data

(60) Provisional application No. 60/283,630, filed on Apr. 16, 2001.

(51) Int. Cl.
*H01L 21/31* (2006.01)
(52) U.S. Cl. .......... 438/765; 438/22; 438/48; 438/775; 438/777
(58) Field of Classification Search .......... None
See application file for complete search history.

(56) References Cited

U.S. PATENT DOCUMENTS

| 4,798,660 A | 1/1989 | Ermer et al. |
| 5,561,317 A | 10/1996 | Momma et al. ............ 257/620 |
| 5,578,503 A | 11/1996 | Karg et al. |
| 5,665,277 A | 9/1997 | Johnson et al. |
| 5,731,131 A | 3/1998 | Momma et al. ............ 430/311 |
| 5,874,684 A | 2/1999 | Parker et al. |
| 5,985,691 A | 11/1999 | Basol et al. |
| 6,068,800 A * | 5/2000 | Singh et al. ............ 264/8 |
| 6,204,912 B1 | 3/2001 | Tsuchiya et al. ............ 355/53 |
| 6,576,355 B1 | 6/2003 | Yadov et al. |
| 6,630,257 B1 | 10/2003 | Ye et al. |
| 6,635,307 B1 | 10/2003 | Huang et al. |

(Continued)

FOREIGN PATENT DOCUMENTS

EP    0 838 864 A2    4/1998

(Continued)

OTHER PUBLICATIONS

W.H. Bloss et al., Thin-Film Solar Cells, Progress In Photovoltaics: Research and Applications, vol. 3, pp. 3-24 (1995), Institute of Physical Electronics, University of Stuttgart, Stuttgart, Germany.

(Continued)

*Primary Examiner*—Dung A. Le
(74) *Attorney, Agent, or Firm*—Pillsbury Winthrop Shaw Pittman LLP

(57) ABSTRACT

A process of forming a compound film includes formulating a nano-powder material with a controlled overall composition and including particles of one solid solution. The nano-powder material is deposited on a substrate to form a layer on the substrate, and the layer is reacted in at least one suitable atmosphere to form the compound film. The compound film may be used in fabrication of a radiation detector or solar cell.

33 Claims, 10 Drawing Sheets

U.S. PATENT DOCUMENTS

| | | | |
|---|---|---|---|
| 6,849,109 B1* | 2/2005 | Yadav et al. | 106/31.13 |
| 6,923,946 B1* | 8/2005 | Geohegan et al. | 423/447.1 |
| 2001/0006869 A1* | 7/2001 | Okamoto et al. | 445/51 |
| 2002/0136896 A1* | 9/2002 | Takikawa et al. | 428/408 |

FOREIGN PATENT DOCUMENTS

| | | |
|---|---|---|
| JP | 4-326507 | 11/1992 |
| WO | WO 99/17889 | 4/1999 |

OTHER PUBLICATIONS

T. Arita et al., CuInSe$_2$ Films Prepared By Screen-Printing and Sintering Method, 1988 IEEE, pp. 1650-1655, Matsushita Battery Industrial Co., Ltd, Osaka, Japan.

Vervaet M. Burgelman et al., Screen Printing of C uInSe$_2$ Films, pp. 4 80-483, Laboratory of Electronics, Ghent State University, Gent, Belgium.

P.R. Subramanian et al., Cu-Ga (Copper-Gallium), Binary Alloy Phase Diagrams, pp. 1410-1412.

P.R. Subramanian et al., The Cu-In (Copper-Indium) System, Bulletin of Alloy Phase Diagrams, vol. 10, No. 5, 1989, pp. 554-568 and 609-610, Carnegie-Mellon University.

T.J. Anderson et al., The Ga-In (Gallium-Indium) System, Journal of Phase Equilibria vol. 12 ,No. 1, 1991.

Max Hansen et al., Constitution of Binary Alloys, pp. 745-746, 1958, McGraw-Hill Book Company.

Bulent M. Basol, Low Cost Techniques for the Preparation of Cu(In,Ga)(Se,S)$_2$ Absorber Layers, Thin Solid Films 361-362(2000), pp. 514-519, International Solar Electric Technology, Inc., Inglewood, CA.

G. Norsworthy et al., CIS Film Growth By Metallic Ink Coating and Selenization, Solar Energy Materials & Solar Cells 60 (2000), pp. 127-134, International Solar Technology Inc. (ISET), Inglewood, CA.

H. Okamoto, Cu-In (Copper-Indium), Journal of Phase Equilibria, vol. 12, No. 6, 1991.

\* cited by examiner

Process Step

METHOD OF FORMING SEMICONDUCTOR COMPOUND FILM FOR FABRICATION OF ELECTRONIC DEVICE AND FILM PRODUCED BY SAME

This application is a 371 of PCT/US02/11047 Apr. 11, 2002 which claims benefit of 60/283,630 Apr. 16, 2001.

The benefit of the filing date of prior U.S. provisional application Ser. No. 60/283,630, filed Apr. 16, 2001, is hereby claimed, and the entire disclosure of this prior U.S. provisional application is incorporated herein by reference.

FIELD OF THE INVENTION

The present invention relates to methods of preparing polycrystalline thin films of semiconductors for active or passive electronic component and device applications especially for the fabrication of radiation detectors and solar cells.

BACKGROUND

Solar cells convert sunlight directly into electricity. These electronic devices are commonly fabricated on silicon (Si) wafers. However, the cost of electricity generated using silicon-based solar cells is rather high, compared to electricity generated by the traditional methods, such as fossil-fuel-burning power plants. To make solar cells more economically viable, low-cost, thin-film growth techniques that can deposit high-quality light-absorbing semiconductor materials need to be developed. These techniques need to employ cost-effective approaches to grow solar cell absorbers on large-area substrates with high throughput and high materials utilization. Therefore, low-cost and high-efficiency thin film solar cell fabrication requires: i) a solar cell absorber material that fundamentally has the capability to yield high-efficiency devices, ii) a low-cost deposition technique that can deposit this absorber material in the form of a high-quality thin film on a low-cost substrate. Both of these ingredients are necessary for manufacturing high-efficiency, low-cost solar cell structures. When solar cells formed on large-area substrates are interconnected, modules with higher voltage and power output are obtained.

Copper-indium-gallium-sulfo-selenide, $Cu(In,Ga)(S,Se)_2$, compounds are excellent absorber materials for thin-film solar cell structures provided that their structural and electronic properties are good. An important compositional parameter of $Cu(In,Ga)(S,Se)_2$ thin films is the metals molar ratio of $Cu/(In+Ga)$. The typically acceptable range of this molar ratio for high-efficiency solar cell absorbers is about 0.70–1.0, although in some cases when the compound is doped with a dopant such as sodium (Na), potassium (K) or lithium (Li), this ratio can go even lower. If the $Cu/(In+Ga)$ molar ratio exceeds 1.0, however, a low-resistivity copper selenide, sulfide or sulfo-selenide phase precipitates and deteriorates the performance of the device due to electrical shorting paths it creates through the absorber. Therefore, control of the $Cu/(In+Ga)$ ratio is important for any technique that is used for the preparation of $Cu(In,Ga)(S,Se)_2$ films for radiation detector or solar cell applications. The $Ga/(In+Ga)$ ratio is also important to control since this ratio determines the bandgap of the absorber, which can be varied from about 1 eV (for $CuInSe_2$) to 2.43 eV (for $CuGaS_2$). In principal the $Ga/(In+Ga)$ ratio may vary from zero in $CuIn(S,Se)_2$ to 1.0 in $CuGa(S,Se)_2$. However, laboratory experience to date has shown that best device efficiencies are obtained for $Ga/(In+Ga)$ ratios in the range of 0.1–0.3.

Although important to control, the $Cu/(In+Ga)$ and $Ga/(In+Ga)$ ratios are not the only factors that influence the electronic properties of $Cu(In,Ga)(S,Se)_2$ compound thin films. The compositional ratios of a compound film may be within the acceptable ranges, but solar cells fabricated on this film may still have poor light-to-electricity conversion efficiencies. $Cu(In,Ga)(S,Se)_2$ compound thin films used in high-efficiency solar cell structures, besides having the right composition, also need to have good morphology and large-grain structure. For example, a typical high-quality $Cu(In,Ga)(S,Se)_2$ thin film is 1.0–3.0 µm thick; it is dense and it has columnar grains with widths of at least 0.5 µm.

One approach that yielded high-quality $Cu(In,Ga)Se_2$ films for solar cell applications is co-evaporation of Cu, In, Ga and Se onto heated substrates in a vacuum chamber [see for example, Bloss et al., "Thin Film Solar Cells", Progress in Photovoltaics, 1995, vol. 3, page 3]. Absorbers grown by this technique are typically dense and they have large columnar grains. The $Cu/(In+Ga)$ ratio and the $Ga/(In+Ga)$ ratio are closely controlled during deposition by monitoring and controlling the individual evaporation rates of Cu, In and Ga. Consequently, $Cu(In,Ga)Se_2$ solar cells fabricated on co-evaporated absorbers yielded small, laboratory-size solar cells with close to 19% conversion efficiency. Although there are now concentrated efforts to apply this technique to the fabrication of large-area $Cu(In,Ga)Se_2$ modules, the method is not readily adaptable to low-cost production of large-area films, mainly because control of $Cu/(In+Ga)$ and $Ga/(In+Ga)$ ratios by evaporation over large-area substrates is difficult, materials utilization is low and the cost of vacuum equipment is high.

Another technique for growing $Cu(In,Ga)(S,Se)_2$ type compound thin films for solar cell applications is the two-stage processes where at least two components of the compound are first deposited onto a substrate, and then reacted with each other and/or with a reactive atmosphere in a high-temperature annealing process. U.S. Pat. No. 4,798,660 issued to J. Ermer et al. teaches a method for fabricating a $CuInSe_2$ film comprising sequentially depositing a film of Cu on a substrate by DC magnetron sputtering and depositing In on said film of Cu and heating the composite film in the presence of Se to form the compound. This approach is schematically depicted in FIG. 1, as it would be applied to the growth of a $Cu(In,Ga)Se_2$ thin film. In FIG. 1, a Cu sub-layer 12 is first deposited on a substrate 10 which has a metallic film 11, such as molybdenum (Mo) on its surface. Then a (In+Ga) sub-layer 13 is deposited over the Cu sub-layer 12 to form the composite layer 14. Later in the process, the complete structure of FIG. 1 is heated in the presence of Se vapors to convert the composite layer 14 into a $Cu(In,Ga)Se_2$ compound layer.

Karg et al. in U.S. Pat. No. 5,578,503 teach an alternate two-stage technique where a Cu film, an In or Ga film and a S or Se film are deposited on a substrate to form a stacked layer and then this stacked layer is heated rapidly to form the compound. The stacked structure of this prior art approach is depicted in FIG. 2, as it would be applied to the growth of a $Cu(In,Ga)Se_2$ solar cell absorber. In FIG. 2, a Cu sub-layer 22 is first deposited over the metal film 21 which is previously coated on substrate 20. This is followed by the depositions of a (In+Ga) sub-layer 23 and a Se sub-layer 24. All the sub-layers form the stacked layer 25 which is then converted into a $Cu(In,Ga)Se_2$ compound layer when the whole structure of FIG. 2 is rapidly heated in a rapid thermal processing (RTP) furnace.

Yet another two-stage processing approach is taught in European Patent application No EP0838864A2 by K. Kushiya et al. In that method a stacked precursor comprising a Cu—Ga sub-layer and an In sub-layer was employed. This method is schematically shown in FIG. 3 as it would be applied to the growth of a Cu(In,Ga)Se$_2$ absorber. According to FIG. 3, a Cu—Ga sub-layer 32 is first deposited over the metal contact layer 31 which was previously deposited on the surface of substrate 30. An In sub-layer 33 is then deposited over the Cu—Ga sub-layer 32. The structure of FIG. 3 is then annealed in the presence of Se vapors to convert the multi-layer 34 into a Cu(In,Ga)Se$_2$ layer. Further annealing in H$_2$S yields a Cu(In,Ga)(S,Se)$_2$ film.

All of the prior art two-stage techniques reviewed above yielded high-quality compound films in terms of their structural and electronic properties. Large-scale manufacturing, however, also requires strict control of the material composition over large-area substrates. This means that in the two-stage processes that utilize a stack of various sub-layers, the uniformity and thickness of each sub-layer have to be individually controlled over large-area substrates. This is very difficult. DC magnetron sputtering techniques which are commonly used to deposit the sub-layers of FIGS. 1, 2 and 3 are expensive vacuum techniques with low materials utilization. Therefore, their cost is high.

Since compositional control, especially the control of the Cu/(In+Ga) ratio is important for Cu(In,Ga)(S,Se)$_2$ compounds, attempts have been made to fix this ratio in an initial material, before the deposition process, and then transfer this fixed composition into a thin film formed using this initial material. T. Arita et al. in their 1988 publication [20th IEEE PV Specialists Conference, 1988, page 1650] described a screen printing technique that involved mixing and milling pure Cu, In and Se powders in the compositional ratio of 1:1:2 and forming a screen printable paste, screen printing the paste on a substrate, and sintering this film to form the compound layer. They reported that although they had started with elemental Cu, In and Se powders, after the milling step the paste contained the CuInSe$_2$ phase. Solar cells fabricated on the sintered layers had very low efficiencies because the structural and electronic quality of these absorbers were poor.

Thin layers of CuInSe$_2$ deposited by a screen printing method were also reported by A. Vervaet et al. [9th European Communities PV Solar Energy Conference, 1989, page 480]. In that work a CuInSe$_2$ powder was used along with Se powder to prepare a screen printable paste. Layers formed by screen printing were sintered at high temperature. A difficulty in this approach was finding a suitable fluxing agent for dense CuInSe$_2$ film formation. Therefore, solar cells fabricated on the resulting layers had poor conversion efficiencies.

U.S. Pat. No. 5,985,691 issued to B. M. Basol et al describes another particle-based method to form a Group IB-IIIA-VIA compound film, where IB=Cu, Ag, Au, IIIA=In, Ga, Al, Tl, and VIA=S, Se, Te. The described method includes the steps of preparing a source material, depositing the source material on a base to form a precursor, and heating the precursor to form a film. In that invention the source material includes Group IB-IIIA alloy-containing particles having at least one Group IB-IIIA alloy phase, with Group IB-IIIA alloys constituting greater than about 50 molar percent of the Group IB elements and greater than about 50 molar percent of the Group IIIA elements in the source material. The powder is milled to reduce its particle size and then used in the preparation of an ink which is deposited on the substrate in the form of a precursor layer. The precursor layer is then exposed to an atmosphere containing Group VIA vapors at elevated temperatures to convert the film into the compound. The precursor films deposited using this technique were porous and they yielded porous CuInSe$_2$ layers with small-grain regions as reported by G. Norsworthy et al. [Solar Energy Materials and Solar Cells, 2000, vol. 60, page 127]. Porous solar cell absorbers yield unstable devices because of the large internal surface area within the device. Also small grains limit the conversion efficiency of solar cells.

PCT application No. WO 99/17889 (Apr. 15, 1999) by C. Eberspacher et al. describes methods for forming solar cell materials from particulates where various approaches of making the particulates of various chemical compositions and depositing them on substrates are discussed.

As the above brief review of prior art demonstrates, there have been attempts to use Cu(In,Ga)Se$_2$ compound powders, oxide containing particles, and Cu—(In,Ga) alloy powders with (In,Ga)-rich compositions, to form precursor layers which were then treated at high temperatures to form Cu(In,Ga)Se$_2$ compound films. These techniques were successful in demonstrating compositional control. In other words the overall composition of the powder was directly transferred into the precursor layer and then into the compound layer. As discussed previously however, composition is only one of the important parameters of high-quality solar cell absorbers. The other important parameters are the morphology and the grain size, which directly influence the electronic properties of these films. Solar cell absorbers need to be dense layers with large grain size. This requires precursor layers that are dense and compositionally uniform both in micro-scale and macro-scale. Repeatability and the overall yield of the process further requires the quality of the source material or the initial powder material to be repeatable. This means that the chemical composition and the phase content of the individual particles comprising the powder need to be well controlled and repeatable.

To this end, there is a need for a low-cost method that has the capability to form Cu(In,Ga)(S,Se)$_2$ thin films over large-area substrates with controlled compositional uniformity, good structural and electronic properties in a repeatable manner with high yield.

SUMMARY OF THE INVENTION

In accordance with the invention, a method of forming a Cu(In,Ga)(S,Se)$_2$ semiconductor compound film includes the steps of formulating a nano-powder material with controlled phase content and overall composition, depositing the nano-powder on a substrate to form a micro-layer and heating and reacting the micro-layer in suitable atmosphere(s) to form a Cu(In,Ga)(S,Se)$_2$ semiconductor compound film. The nano-powder material may contain nano-size particles of only solid solutions or elemental forms of Cu, In, and Ga. Additionally particles of at least one of Se, S and Te may be included in the nano-powder. The nano-powder material may also contain a dopant to enhance p-typeness of the semiconductor compound film. The Cu(In, Ga)(S,Se)$_2$ semiconductor compound film of the present invention may be used in electronic device structures including solar cells.

More generally, according to the invention, a process of forming a compound film includes formulating a nano-powder material with a controlled overall composition and having particles of one solid solution. The nano-powder material is deposited on a substrate to form a layer on the substrate, and this layer is reacted in at least one suitable atmosphere to form the compound film. The invention also concerns a semiconductor compound film for use in fabrication of a radiation detector or solar cell made by such a process, as well as a powder material, for use in preparing such a compound film on a substrate, comprising particles of a copper-gallium solid solution which are sub-micronic in size. According to one preferred embodiment, the compound film has a Cu/(In+Ga) compositional range of 0.7–1.0 and a Ga/(In+Ga) compositional range of 0.05–0.3.

The foregoing and additional features and advantages of this invention will become further apparent from the detailed description and accompanying drawings that follow. In the figures and written description, numerals indicate the various features of the invention, like numerals referring to like features.

DETAILED DESCRIPTION

Figure 1:
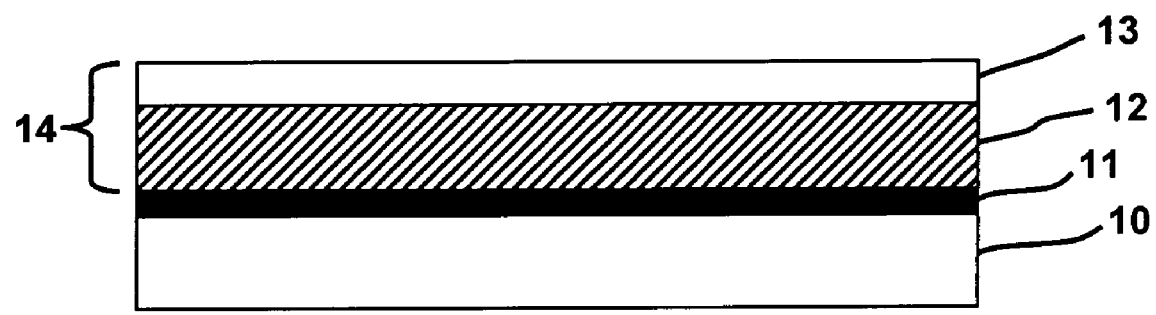
FIG. 1 is a schematic representation of a composite layer employed in a prior art two-stage technique for the growth of a $Cu(In,Ga)Se_2$ compound film.
Figure 2:
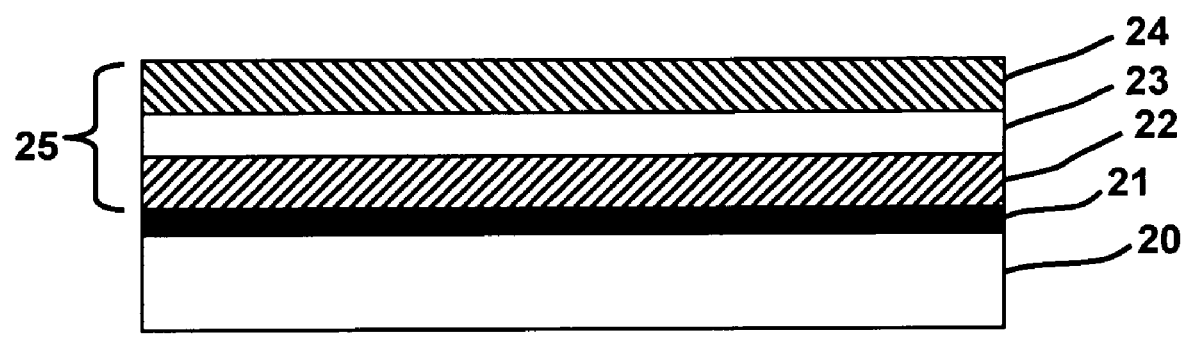
FIG. 2 is a schematic representation of a stacked layer employed in another prior art two-stage technique for the growth of a $Cu(In,Ga)Se_2$ compound film.
Figure 3:
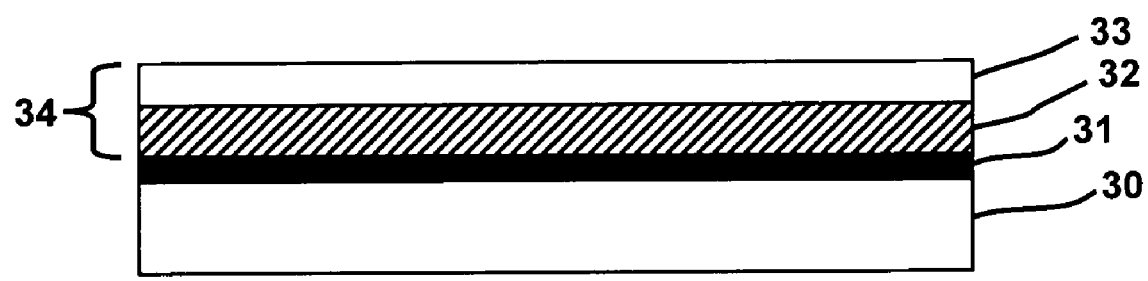
FIG. 3 is a schematic representation of a multi-layer structure employed in yet another prior art two-stage technique for the growth of a $Cu(In,Ga)Se_2$ compound film.
Figure 4:
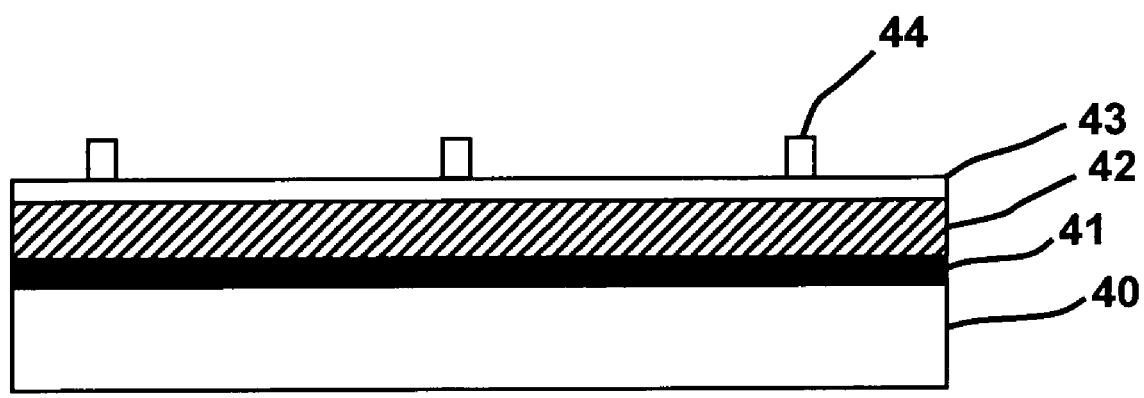
FIG. 4 is the general structure of a $Cu(In,Ga)(S,Se)_2$ compound solar cell that may be constructed using the compound absorbers grown by the method of the present invention.

The general structure of a $Cu(In,Ga)(S,Se)_2$ compound solar cell that may be constructed using the compound absorbers grown by the method of present invention is shown in FIG. 4. The device is fabricated on a substrate that includes a base 40 and a conductive contact layer 41. The base 40 may be made of various conductive or insulating, rigid or flexible materials, such as glass or flexible foils made of Mo, Ti, stainless steel, polyimide, mica and like. The p-type compound absorber film 42 is deposited over the conductive contact layer 41 which is traditionally made of Mo but may also be made of Ta, W, their alloys or nitrides. It is important that the conductive contact layer 41 is stable and does not appreciably react with other elements within the solar cell structure or the reaction environments used to form the solar cell structure. An n-type transparent window layer 43 is formed on the p-type compound absorber film 42, through which light enters the device. Metallic finger patterns 44 may be deposited over the window layer 43, if necessary.

Although the present invention is described for the growth of $Cu(In,Ga)(S,Se)_2$ as the p-type compound absorber film 42, tellurium may also be included into the composition to grow $Cu(In,Ga)(S, Se, Te)_2$ compounds. The compound layer may additionally contain dopants such as potassium (K), sodium (Na), lithium (Li), phosphorous (P), arsenic (As), antimony (Sb) and bismuth (Bi) to enhance its electronic properties.

The transparent window layer 43 may have one or more layers made of materials commonly used in solar cell window layer structures. For example the transparent window layer may contain layers of cadmium-sulfide, cadmium-zinc-sulfide, zinc-selenide, zinc-oxide, indium-tin-oxide, indium-zinc-oxide and tin oxide, among many others.

The preferred cell structure of FIG. 4 is commonly referred to as a "substrate-type" structure. A "superstrate-type" structure can also be constructed by depositing a window layer first on a transparent base such as glass, then depositing the $Cu(In,Ga)(S,Se)_2$ compound absorber film, and finally forming a back ohmic contact to the device by a conductive layer. In this "superstrate-type" structure, which is commonly known in the field, light enters the device again from the window layer.

Figure 5:
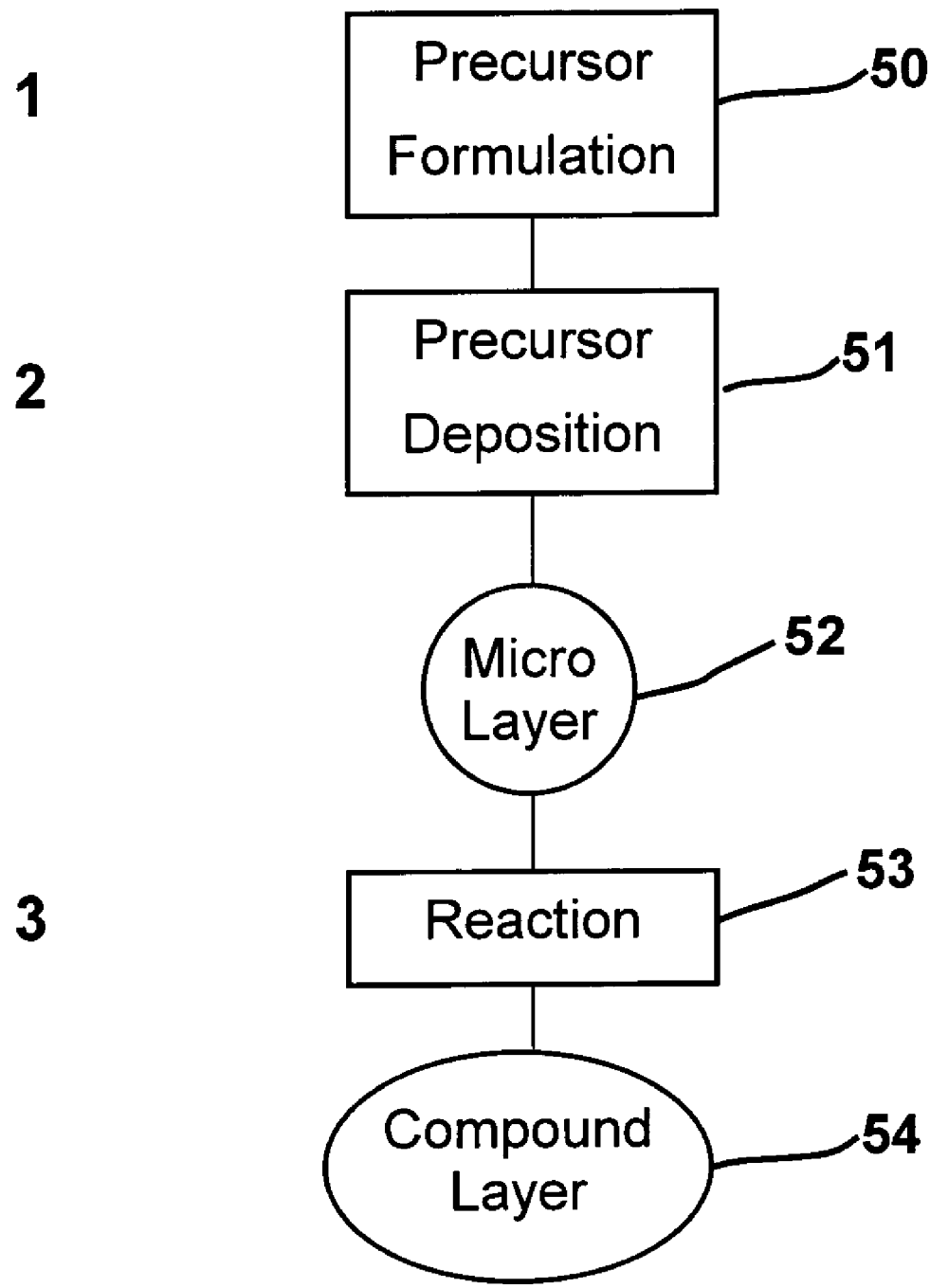
FIG. 5 is a flow chart showing the steps of a method used to grow $Cu(In,Ga)(S,Se)_2$ compound thin films, in accordance with the present invention.

FIG. 5 shows the general steps of the compound film growth process of the present invention. In this figure process steps are identified in rectangular boxes and the results are identified in circles. Accordingly, the first step in the film growth process of the present invention is precursor formulation 50. The second process step is precursor deposition 51, which involves depositing the formulated precursor onto the surface of a substrate to form a micro-layer 52. The micro-layer 52 is then converted into the $Cu(In,Ga)(S, Se)_2$ compound layer 54 through the third process step which is identified as reaction 53 in FIG. 5.

Figure 6:
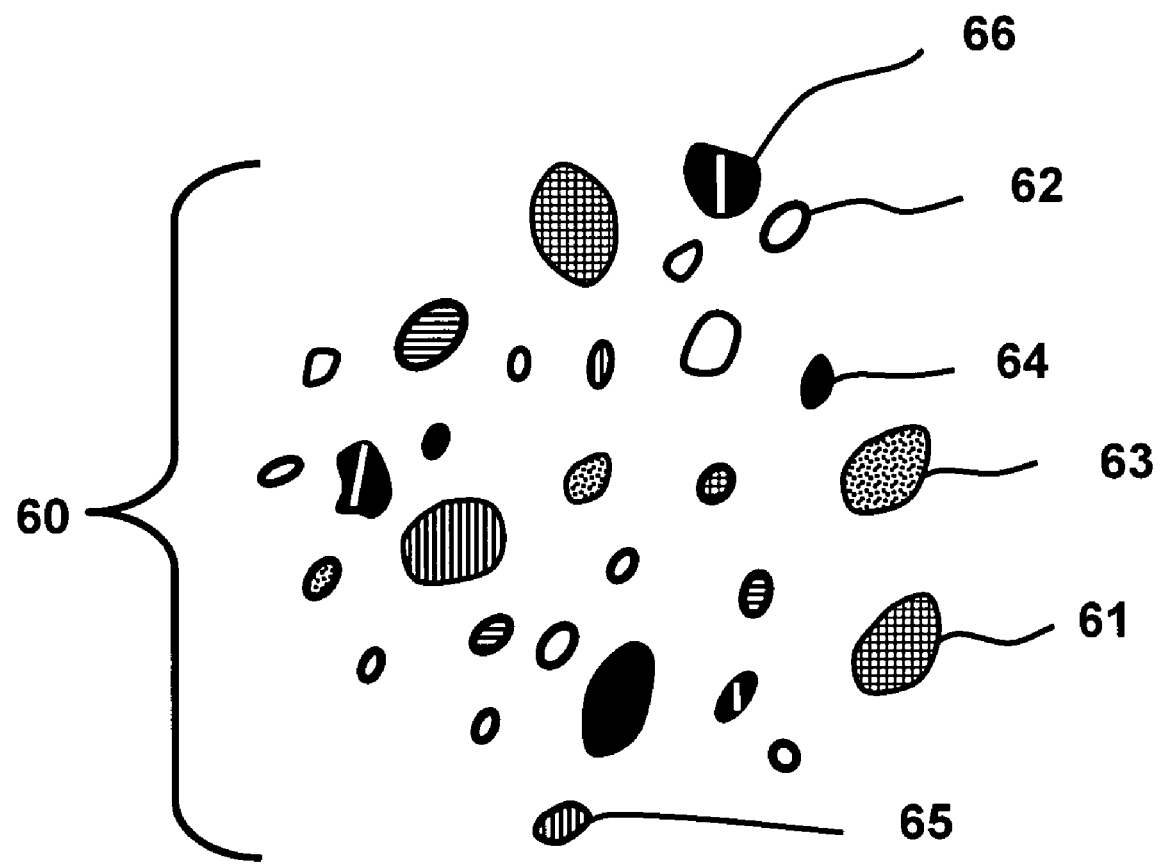
FIG. 6 is a schematic drawing showing the composition of the nano-powder.

Precursor used in precursor formulation 50 step comprises a nano-powder, i.e. a powdered material with nano-meter size particles. Compositions of the particles constituting the nano-powder used in precursor formulation 50 step are important for the repeatability of the process and the quality of the compound films grown by the method of the present invention. As schematically shown in FIG. 6 the nano-powder 60 of the present invention is a collection of small particles. These particles are preferably near-spherical in shape and their diameters are less than about 200 nm, and preferably less than about 100 nm. Alternately, nano-powder 60 may contain particles in the form of small platelets. The nano-powder 60 preferably contains copper-gallium solid solution particles 61, and at least one of indium particles 62, indium-gallium solid-solution particles 63, copper-indium solid solution particles 64, and copper particles 65. Alternately, the nano-powder may contain copper particles and indium-gallium solid-solution particles. The nano-powder 60 may additionally contain Group VIA particles 66. Group VIA particles 66 may be made of at least one of Se, S and Te or their alloys or solid solutions.

Precursor formulation 50 step of FIG. 5 involves processes or operations that transform the nano-powder 60 into a form that is suitable for deposition onto a substrate. Therefore, precursor formulation 50 step may, for example, involve mixing the nano-powder with well known solvents, carriers, dispersants etc. to prepare an ink or a paste that is suitable for deposition onto a substrate. Alternately, nano-powder particles may be prepared for deposition on a substrate through dry processes such as dry powder spraying, electrostatic spraying or processes which are used in copying machines and which involve rendering charge onto particles which are then deposited onto substrates.

After precursor formulation 50 step, the precursor, and thus the nano-powder constituents have to be deposited onto a substrate in the form of a micro-layer through the precursor deposition step 51. As indicated before, precursor deposition step may involve dry or wet processes. Dry processes include electrostatic powder deposition approaches where the prepared powder particles may be coated with poorly conducting or insulating materials that can hold charge. Charged powders may then be deposited on substrates that are biased in a way to attract the charged particles. The materials coating the powder particles may be selected from amongst organic materials so that upon heating they substantially burn or evaporate away without leaving any residues that would deleteriously affect the compound films to be grown. Some examples of wet processes are screen printing, ink jet printing, ink deposition by doctor-blading, reverse roll coating etc. In these approaches the nano-powder may be mixed with a carrier which may typically be a water-based or organic solvent. Well-known additives may then be added into the formulation to form either a thick paste (for screen printing) or a thin dispersion (for ink or slurry deposition). Examples of these additives include a large variety of ionic and non-ionic dispersants marketed by companies such as Rohm and Haas, thickening agents, pH-adjustment agents, surfactants, binders etc. It is preferred that the carrier be a volatile material that once evaporated out of the wet micro-layer, leaves substantially no residue behind that would have deleterious effect on the compound film. The same is also valid for all the other chemical agents used in the precursor formulation. Some examples of the commonly used carriers are water, alcohols, ethylene glycol, etc.

Figure 7:
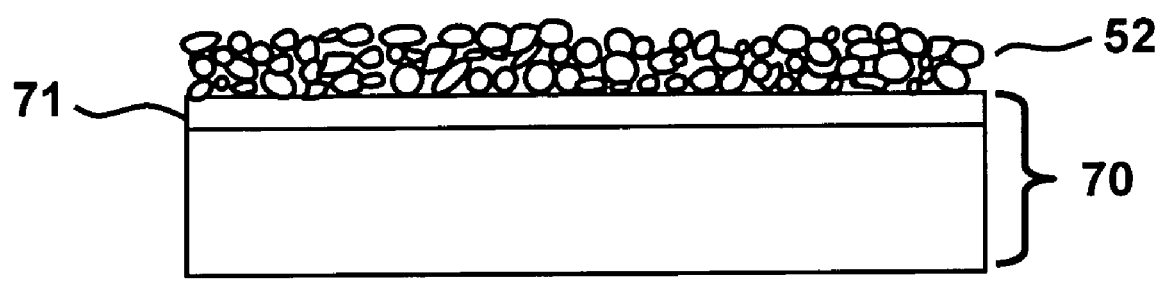
FIG. 7 shows the micro-layer obtained as a result of depositing the precursor containing the nano-powder.

Once the carrier and other agents in the precursor formulation are totally or substantially evaporated away, the micro-layer 52 is formed on the substrate 70 as shown in FIG. 7. The micro-layer 52 is made of the nano-size particles of the nano-powder distributed in a dense matrix. It should be noted that the most preferred shape of nano-powder particles is spherical or near spherical. For a uniform size distribution, spherical particles can give about 75% volume density when closely packed into a film. If the particle sizes are varied, i.e. if there is a size distribution of particles, this packing density can be made even higher by filing the gaps between larger particles with smaller particles. Another preferable shape of the particles is flat plates. With this shape it is possible to get films with over 90% density. The substrate 70 in FIG. 7 is a general representation. As explained before the substrate 70 preferably comprises a conductive layer 71 on its surface.

The nano-size particles of the present invention contain soft, elemental and solid-solution materials such as In and In—Ga solid solutions. Therefore, the preferred method of preparing an ink or a paste include process steps of mixing and dispersing but not milling or grinding. In other words the preferred size of the particles in the present invention is less than about 200 nm. This way no mechanical grinding or milling should be necessary for further size reduction although such processes may also be employed. If milling or mechanical grinding is not used in precursor formulation step 50, mixing, blending, sonicating etc. steps may be carried out to form a uniform mixture or dispersion ready to be deposited on the substrate in the form of a micro-layer. The substrate temperature during the precursor deposition 51 step may be in the 20–400 C range. Preferably it should be in the 20–150 C range so that the deposition process can be carried out in air rather than in an oxygen-free atmosphere.

Once the micro-layer 52 is formed on the selected substrate it has to be reacted to form the compound film. The reaction step involves at least one annealing process. Annealing may involve furnace-annealing, RTP or laser-annealing, microwave annealing, among others. Annealing temperatures may be in 350–600 C and preferably between 400–550 C. If the micro-layer 52 contains Group VIA particles 66, the annealing atmosphere may be inert. In this case the Group VIA particles react with the metallic particles to form the compound. If there is no Group VIA particles in the nano-powder and thus in the micro-layer, or if the amount of Group VIA particles is not adequate then the reaction step should employ an atmosphere with the vapors of at least one of Group VIA elements (Se,S,Te). It should be understood that the reaction step may consists of two or more annealing processes each with different temperature time profiles and different atmospheres. For example, in the case of metallic micro-films there may be three annealing processes. In the first process which may be carried out at temperatures of 100–300 C, the micro-layer is annealed in inert atmosphere or vacuum to dry the film and to get any impurities out or to fuse and alloy the film and reduce the porosity. The second annealing process may employ a Se-containing atmosphere to grow a $Cu(In,Ga)Se_2$ film. There may be a third annealing process where the $Cu(In,Ga)Se_2$ film is heated in a S-containing atmosphere to convert it into a $Cu(In,Ga)(S,Se)_2$ layer. Alternately, the sequence of the second and third heating processes may be changed to form first a S-containing compound and then the $Cu(In,Ga)(S,Se)_2$ compound. The first heating process may altogether be skipped.

Although a $Cu(In,Ga)(S,Se)_2$ compound is used as an example, other compounds in the same family (such as compounds containing Al, Tl, Ag and/or Te) may also be formed using the present invention. Similarly compounds from other groups such as Group IIB(Cd,Zn)-IVA(Si,Ge,Sn)-VA(P,As,Sb) and Group IB-VA-VIA compounds may also be grown using the present invention provided that solid solutions exist in their respective binary diagrams.

Referring back to FIG. 6, the copper-gallium solid solution particles 61 have the general chemical composition of $Cu_{1-x}Ga_x$, where $x \leq 0.22$, preferably $x \leq 0.18$. Indium-gallium solid solution particles 63 have the general chemical composition of $In_{1-y}Ga_y$, where $y \leq 0.04$, preferably $y \leq 0.03$. Copper-indium solid solution particles 64 have the general chemical composition of $Cu_{1-z}In_z$, where $z \leq 0.11$, preferably $z \leq 0.02$. These compositional limits assigned to the articles of the present invention assure that all the metallic particles in the formulation of the nano-powder 60 are either pure metals (such as Cu and In) or solid solutions which can be repeatably manufactured. This point will now be clarified further by referring to the phase diagrams replicated in FIGS. 8a, 8b and 8c.

Figure 8A:
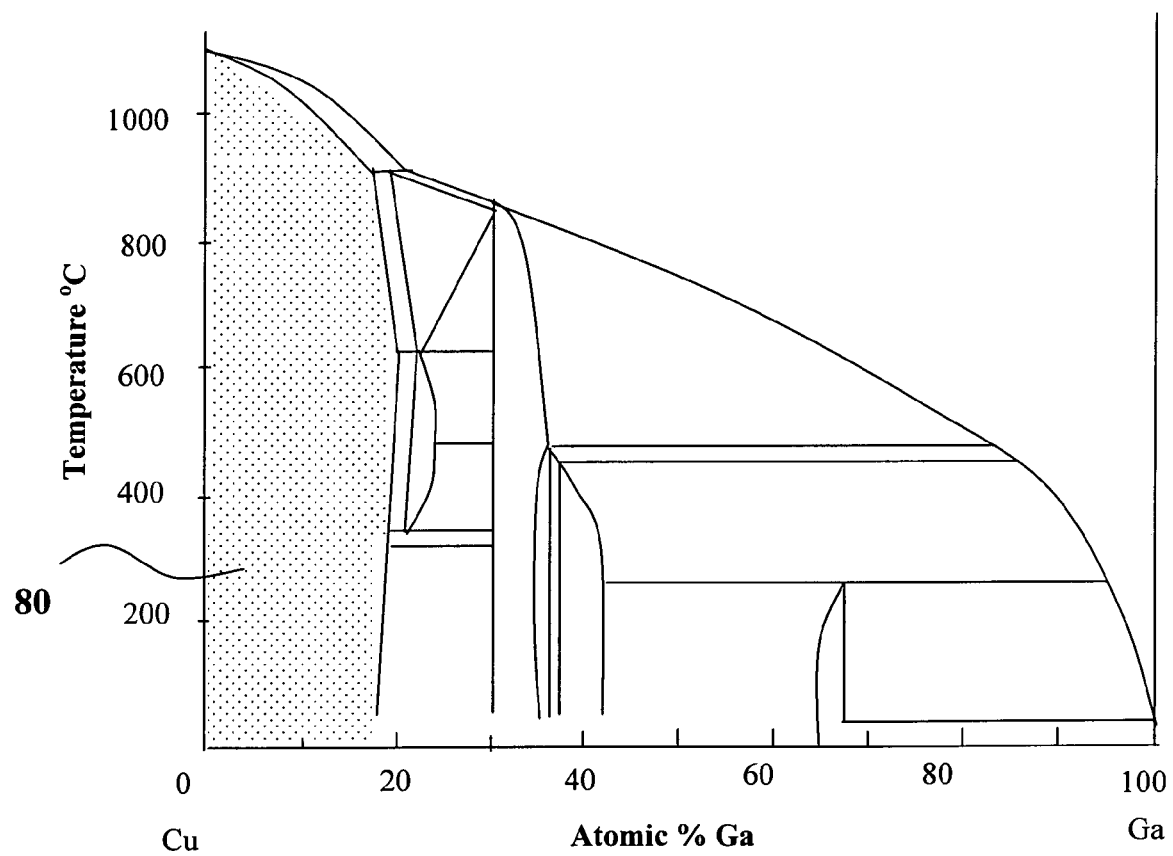
FIG. 8*a* is a schematic drawing of copper-gallium phase diagram.

FIG. 8a schematically shows a copper-gallium binary phase diagram [P. R. Subramanian and D. E. Laughlin, in Binary Alloy Phase Diagrams, page 1410]. As can be seen from this figure the maximum solid solubility of Ga in Cu lies at about 22 atomic % Ga at the peritectoid temperature of 620 C, and 18 atomic % Ga near room temperature. There is, on the other hand, very little or no solubility of Cu in Ga. This means that the dotted region 80 in FIG. 8a contains the single-phase copper-gallium solid solution with properties that are close to those of pure copper. The portion of the phase diagram of FIG. 8a which lies outside the dotted region 80 is very complex with multiple Cu-rich and Ga-rich alloy phases such as $Cu_2Ga$ (33% Ga), $Cu_9Ga_4$ (29% Ga), $Cu_3Ga$ (25% Ga), $Cu_3Ga_2$ (40% Ga) and $CuGa_2$ (67% Ga). Consequently any Cu—Ga alloy with Ga-content of about higher than 22 atomic percent (such as those alloys utilized in U.S. Pat. No. 5,985,691) would most likely contain multiple Cu—Ga alloy phases unless the selected composition exactly matches to the composition of one of the stable phases. Even then, synthesis of the single phase material which lies in the middle of a phase diagram with multiple phases is very challenging and often requires very high accuracy, long heating cycles etc. Fabrication of particles/powders containing only simple solid solutions, on the other hand, is simple and repeatable. Elemental powders of Cu and In can be prepared in nano-sizes without difficulty. Particles of copper-gallium, copper-indium, indium-gallium solid-solutions can also be prepared using the same techniques used for the preparation of elemental powders. This means that such solid solution powders can be fabricated in a repeatable manner with high yield and small particle size. Use of such powders then assure the quality and repeatability of the compound forming process of the present invention. One of the techniques successfully used for making Cu nano particles, for example, involve sputtering copper out of a Cu target into inert gas at high pressure. The sputtered Cu nano-clusters quench in the inert gas and get collected. This technique can easily be adapted to prepare solid solution particles, such as Cu—Ga solid-solution particles with Ga content less than 22 atomic percent, because sputtering targets of solid solutions can be readily fabricated just like elemental metals. When sputtered into inert gas, solid-solution nano-particles with compositions similar to that of the target can be obtained. If, on the other hand, a target of complex alloy phases such as a Cu—Ga alloy target with Ga content over 22% is attempted to be used for the same purpose, different portions of the target would contain different phases with varying sputtering yields. The resulting particles would not be uniform in composition. The method of melt spraying which was used in U.S. Pat. No. 5,985,691, on the other hand would give relatively large particles (typically larger than 1 micron) with different phases each of which have different melting points and Cu/Ga metallic ratios.

Figure 8B:
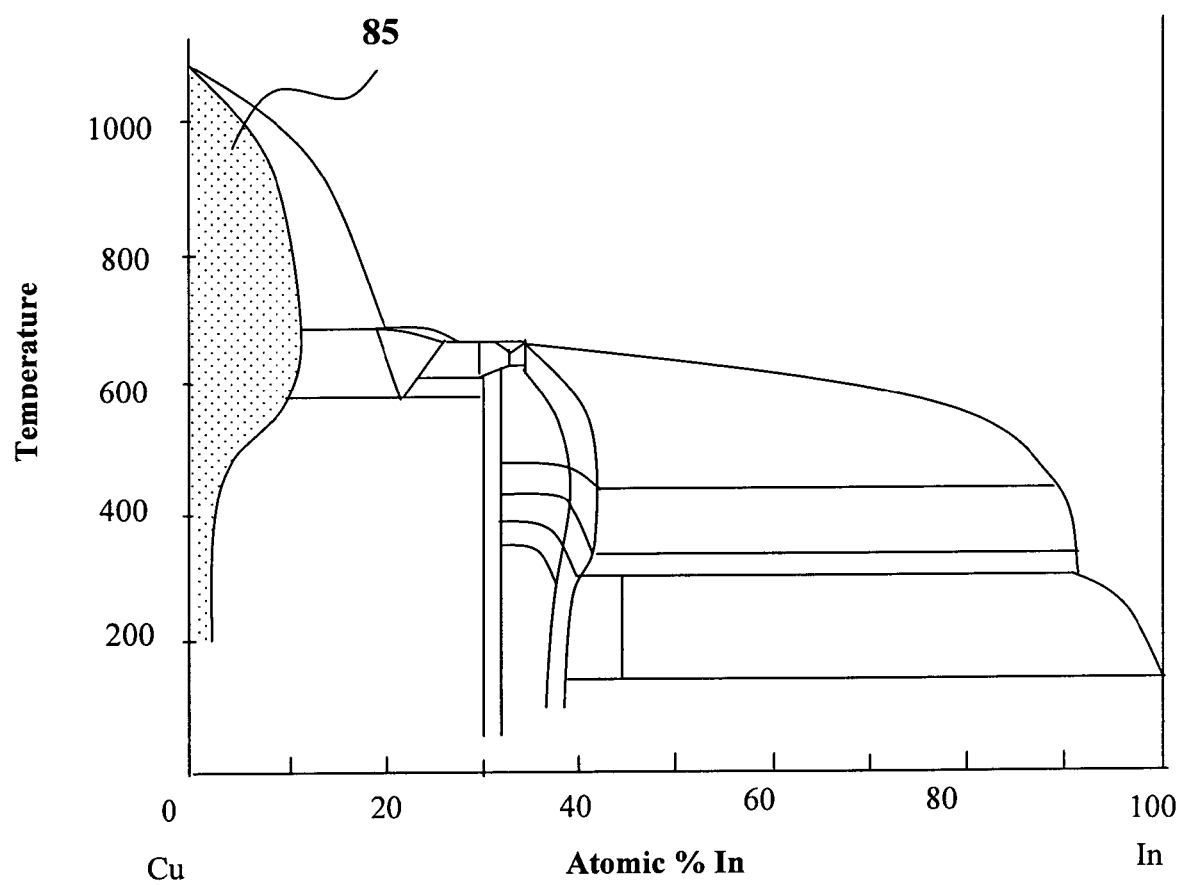
FIG. 8*b* is a schematic drawing of copper-indium phase diagram.

The phase diagram for copper-indium is shown schematically in FIG. 8b [P. R. Subramanian and D. E. Laughlin, "The Cu—In system", Bulletin of Alloy Phase Diagrams, 1989, vol. 10, No.5, page 554]. Various phases identified in this diagram include Cu-rich and In-rich alloy compositions such as $Cu_{11}In_9$ (45% In), $CuIn_2$ (66% In), $Cu_{16}In_9$ (36% In), $Cu_9In_4$ (31% In), $Cu_7In_3$ (30% In), and $Cu_7In_4$ (36% In). There is negligible solid solubility of Cu in In, whereas the maximum solubility of In in Cu is about 11 atomic % and it is at about 574 C. Near room temperature this solubility is reduced to about 2%, as can be seen from FIG. 8b. Therefore, solid solution with up to 11% indium content can be easily synthesized at 574 C and then the material can be quenched down to room temperature to preserve this composition. If the In content of the solution is limited to only 2%, on the other hand, material synthesis is even easier and there is no need for special processing or even quenching, and the resultant material is assured to be a single-phase solid solution. Accordingly, the shaded region 85 in FIG. 8b corresponds to the single-phase copper-indium solid solution which has properties very close to that of Cu. Powders of the solid-solution compositions can be prepared in nano sizes in a repeatable manner with controlled phase (thus composition) content.

Figure 8C:
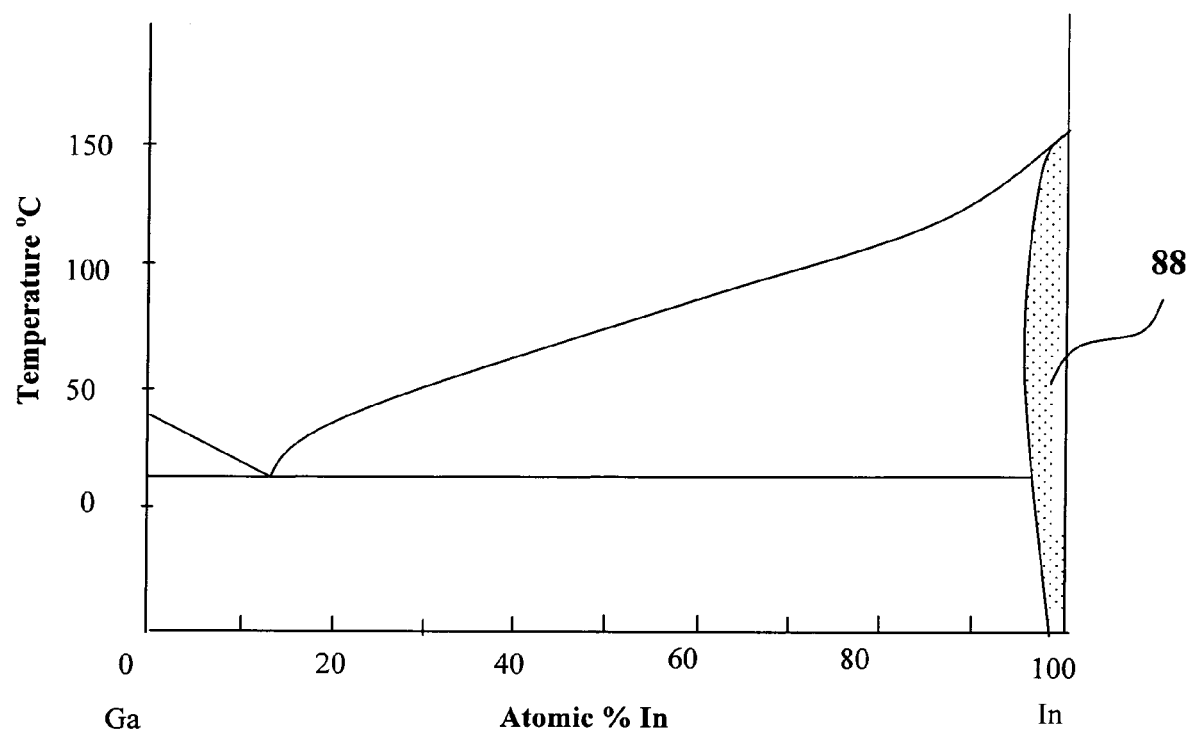
FIG. 8*c* is a schematic drawing of gallium-indium phase diagram.

The schematic gallium-indium phase diagram of FIG. 8c [T. J. Anderson and I. Ansara, J. Phase Equilibria, vol. 12, No. 1, 1991, page 64] suggests that there is hardly any solubility of In in Ga. However Ga solid solubility in In at about 70 C is about 4% and then drops to about 3% at room temperature. This single-phase solid solution region is shown in FIG. 8c as the shaded region 88. It should be pointed out that there are some older reports putting the solid solubility limit of Ga in In to much higher value of 18% [M. Hansen, "Constitution of Binary Alloys", second edition, 1958, page 745], which would increase the shaded region 78 of FIG. 8c accordingly.

The phase diagrams of FIGS. 8a, 8b and 8c, and the above discussion demonstrate the complexity of the Cu—Ga, Cu—In, Ga—In alloy systems for all compositions except where solid-solutions exist. It is this complexity that causes uncontrolled variations in processes utilizing Cu—In or Cu—Ga alloy films or alloy particles. The following examples can demonstrate this.

EXAMPLE 1

Based on experimental results to date, the best compositional range for $Cu(In,Ga)(S,Se)_2$ absorbers are Cu/(In+Ga)=0.7–1.0 and Ga/(In+Ga)=0.05–0.3. Consider the case of growing an absorber with Cu/(In+Ga)=1.0 and Ga/(In+Ga)=0.25, i.e. a compound film of $CuIn_{0.75}Ga_{0.25}(S,Se)_2$. If the metallic precursor film of this composition were to be prepared by the prior art technique of U.S. Pat. No. 5,985,691, Cu—Ga, Cu—In, or Cu—In—Ga alloy particles would be utilized where the alloy phase(s) would contain over 50 atomic % of the required Cu and over 50 atomic % of the required Ga and In. These alloy particles would have compositions that are outside the solid-solution regions indicated in FIGS. 8a and 8b. In other words, the alloy particles would contain multi-phases which during processing could change. It should be noted that the situation worsens for Cu/(In+Ga) ratios of smaller than 1.0. In fact this has been observed in experiments with such alloy particles. In a recent publication [B. M. Basol, "Low cost techniques for the preparation of $Cu(In,Ga)(S,Se)_2$ absorber layers", Thin Solid Films, 2000, vol. 361, page. 514] the multi-phase nature of alloy particles containing more than 50 atomic % of the required In was shown. It was also discovered that the phases present changed upon ball milling the powder for the purpose of particle size reduction for ink formulation. Furthermore, milling resulted in irregular particle shapes which yielded porous films.

EXAMPLE 2

Using the present invention the compound layer with a composition close to $CuIn_{0.75}Ga_{0.25}(S,Se)_2$ may be grown in a repeatable manner and with high quality. In this case a copper-gallium solid solution powder is used where the composition is $Cu_{00.78}Ga_{0.22}$. This powder is mixed with a powder of indium-gallium solid solution of $In_{0.97}Ga_{0.03}$ composition. The amounts of each powder are selected so that one mole of the first and one mole of the second are intimately mixed. After forming the micro-film the overall composition of the micro-film yields $Cu_{00.78}Ga_{0.22}+In_{0.97}Ga_{0.03}=Cu_{0.78}In_{0.97}Ga_{0.25}$. Therefore in the compound layer, Cu/(In+Ga)=0.64 and Ga/(In+Ga)=0.20, which are desirable compositional parameters for high quality compound layers when loped.

EXAMPLE 2a

In the above example if 1.28 mole of $Cu_{0.78}Ga_{0.22}$ solid solution powder is mixed with 0.77 mole of $In_{0.97}Ga_{0.03}$ solid solution powder and a micro film of these powders is obtained. After the reaction step the compound would have the composition of 1.28 $Cu_{0.78}Ga_{0.22}$+0.77

$In_{0.97}Ga_{0.03}CuIn_{0.75}Ga_{0.3}$, which means, $Cu/(In+Ga)=0.95$ and $Ga/(Ga+In)=0.29$. These are close to perfect compositional parameters required for undoped compound films yielding high efficiency solar cells. This example demonstrates the flexibility and power of the present invention in changing film composition using just solid solutions. It should be appreciated that amounts of the two solid solutions could be changed to obtain various compound composition. Elemental powders of Cu, In or Ga could also be added in the formulation to further adjust these compositions as desired.

EXAMPLE 3

If the desired Ga content in the micro-film and thus in the compound film is less than the solid solubility of Ga in Cu, then there is no need to use the indium-gallium solid solution. Pure In powder can be used in this case. For example, to grow a $CuIn_{1-k}Ga_k(S,Se)_2$ compound with $k<0.22$, the nano-powder may contain $Cu_{1-k}Ga_k$ solid-solution particles and pure In particles where one mole of the copper-gallium solid-solution powder is mixed with $(1-k)$ mole of pure In powder. Using low melting point pure In or In—Ga solid solution particles in formulations containing Cu—Ga solid solution particles is attractive because upon heating the micro-layer, these low melting phases form a liquid fusing region around the high-melting Cu—Ga solid solution particles.

EXAMPLE 4

Cu—In and Cu—Ga solid solutions may both be used in the formulation of the nano-powder. For example, a $Cu_{1-x}Ga_x+Cu_{1-y}In_y+mIn$ mixture would allow growth of a wide range of compositions of the compound. Since $x \leq 0.22$ and $y \leq 0.11$, the value of m can be adjusted to yield a range of $Ga/(In+Ga)$ ratios. Of course the Ga amount can be easily reduced in this composition. However, for $Cu/(In+Ga)=1.0$, maximum amount of Ga that can be included in the film using this formulation can be calculated as follows:

$$Cu_{0.78}Ga_{0.22}+Cu_{0.89}In_{0.11}+m$$

In is the formulation that would yield $$0.78+0.89=0.22+0.11+m$$

$m=1.34$ $$Ga/(In+Ga)=0.22/(0.22+0.11+1.34)=13\%$$

Therefore, similar calculations may be used to formulate nano-powders containing elemental powders and solid-solution powders and yielding compound films with various compositions after the reaction step.

EXAMPLE 5

Copper-gallium solid solution particles, Cu particles and In particles may also be used to obtain micro-layers and compound layers of various compositions. In this case $wCu_{1-x}Ga_x+u$ Cu+n In would be the formulation of the nano-powder and the composition of the micro-layer and the compound would have $$Cu/(In+Ga) \text{ ratio}=[u+w(1-x)]/(n+wx), \text{ and}$$

$$Ga/(In+Ga) \text{ ratio}=wx/(n+wx), \text{ where } x \leq 0.22$$

Above examples demonstrate the flexibility of the present invention to yield high quality absorber layers with compositional ranges that are most important for high efficiency solar cell fabrication. The present invention uses particles of elements and solid-solutions to mix and formulate nano-powders which are then deposited in thin film form and converted into the desired compound. Mixtures of particles that can be successfully used in this invention include but are not limited to the following mixtures of binary solid solutions and elements (binary solid solutions are solid solutions of two elements): [CuGa+In] (meaning CuGa solid solution particles mixed with In particles), [CuGa+InGa] (meaning CuGa solid solution particles mixed with InGa solid solution particles), [CuGa+InGa+In] (meaning CuGa solid solution particles mixed with InGa solid solution particles and In particles), [CuGa+InGa+Cu] (meaning CuGa solid solution particles mixed with InGa solid solution particles and Cu particles), [CuGa+InGa+Cu+In] (meaning CuGa solid solution particles mixed with InGa solid solution particles, Cu particles and In particles), [CuGa+Cu+In] (meaning CuGa solid solution particles mixed with Cu particles and In particles), [CuGa+CuIn+In] (meaning CuGa solid solution particles mixed with CuIn solid solution particles and In particles), [CuGa+CuIn+InGa] (meaning CuGa solid solution particles mixed with CuIn solid solution particles and InGa solid solution particles), [CuGa+CuIn+InGa+In] (meaning CuGa solid solution particles mixed with CuIn solid solution particles, InGa solid solution particles and In particles), [CuGa+CuIn+Cu+In] (meaning CuGa solid solution particles mixed with CuIn solid solution particles, Cu particles and In particles), [CuGa+CuIn+InGa+Cu] (meaning CuGa solid solution particles mixed with CuIn solid solution particles, InGa solid solution particles and Cu particles), and [CuGa+CuIn+InGa+Cu+In] (meaning CuGa solid solution particles mixed with CuIn solid solution particles, InGa solid solution particles, Cu particles and In particles). By selecting relative amounts of particles in the mixture a whole range of compositions can be obtained by this approach including the ranges necessary for solar cell fabrication. In certain cases a film may be fabricated with high Cu content (outside the range acceptable for solar cell fabrication) but then another film with composition of low Cu can be deposited over the first film bringing the overall composition into the acceptable range. These approaches are well known in the field. It should be noted that the above example formulations did not include elemental Ga powders. If this is done, the number of possible powder formulations that can be used increases even further. However, since Ga is a low-melting material that can oxidize easily, the preferred method of the present invention is introduction of Ga into the formulation in the form of a CuGa or InGa solid solution. Also there is no data available on ternary solid solution region for the CuGaIn alloy system. The present invention foresees the use of particles of such ternary solid solutions. For example, it may be possible to dissolve some In in CuGa solid solution to obtain one or more CuGaIn solid solutions. In such case a powder of this material can be mixed with the powders of the elements and/or the other binary solid solutions listed above.

If the composition of the nano-powder does not contain a group VIA powder, the micro-layer which contains only metallic phases need to be reacted to form the compound film. This reaction step may be carried out in the vapor of Group VIA element (Se, S, Te) or other sources such as $H_2$-Group VIA-type gases such as $H_2S$, $H_2Se$ or their mixtures at elevated temperatures. Once the compound layers are formed solar cells and other electronic devices may be fabricated on these layers using methods well known in the field.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

I claim:

1. A semiconductor compound film made by a process comprising:
   formulating a nano-powder material with a controlled overall composition and including particles of at least one solid solution of Cu, In, and Ga,
   depositing said nano-powder material on a substrate to form a layer on the substrate, and
   reacting the layer in at least one suitable atmosphere to form said compound film,
   wherein said compound film has a Cu/(In+Ga) compositional range of 0.7–1.0 and a Ga/(In+Ga) compositional range of 0.05–0.3.

2. The film of claim 1, wherein said nano-powder material further includes particles of one element selected from the group consisting of copper, indium, and gallium.

3. A process of forming a compound film comprising:
   formulating a nano-powder material with a controlled overall composition and including particles of at least one solid solution of Cu, In, and Ga,
   depositing said nano-powder material on a substrate to form a layer on the substrate, and
   reacting the layer with at least one of S, Se and Te to form said compound film, wherein said compound film has a Cu/(In+Ga) compositional range of 0.7–1.0 and a Ga/(In+Ga) compositional range of 0.05–0.3.

4. The process of claim 3, wherein said at least one solid solution is copper-gallium.

5. The process of claim 4, wherein said nano-powder material further includes particles of at least one element.

6. The process of claim 5, wherein said at least one element is indium.

7. The process of claim 5, wherein said at least one element consists of copper and indium.

8. The process of claim 4, wherein said nano-powder material further includes particles of another solid solution.

9. The process of claim 8, wherein the other solid solution is copper-indium.

10. The process of claim 9, wherein said nano-powder material further includes particles of a further solid solution.

11. The process of claim 10, wherein the further solid solution is indium-gallium.

12. The process of claim 11, wherein said nano-powder material further includes particles of at least one element.

13. The process of claim 12, wherein said at least one element is one of indium, copper and gallium.

14. The process of claim 12, wherein said at least one element consists of copper and gallium.

15. The process of claim 12, wherein said at least one element consists of copper and indium.

16. The process of claim 9, wherein said nano-powder material further includes particles of at least one element.

17. The process of claim 16, wherein said at least one element is indium.

18. The process of claim 16, wherein said at least one element consists of copper and indium.

19. The process of claim 8, wherein the other solid solution is indium-gallium.

20. The process of claim 19, wherein said nano-powder material further includes particles of at least one element.

21. The process of claim 20, wherein said at least one element is one of indium, copper and gallium.

22. The process of claim 20, wherein said at least one element consists of copper and gallium.

23. The process of claim 20, wherein said at least one element consists of indium and copper.

24. The process of any one of claims 19, 21–23, 6, 7, 11, 13–15, 17, and 18, wherein said nano-powder material additionally includes particles of a CuGaIn solid solution.

25. The process of claim 24, wherein said nano-powder material additionally includes particles of at least one of selenium, sulfur, and tellurium.

26. The process of any one of claims 3–18, wherein said nano-powder material additionally includes particles of at least one of selenium, sulfur, and tellurium.

27. The process of claim 3, wherein said particles have diameters of no more than about 200 nanometers.

28. The process of claim 3, wherein the particles are nearly spherical in shape.

29. The process of claim 3, wherein the particles are formed as platelets.

30. The process of claim 3 further comprising a step of annealing after the step of depositing.

31. The process of claim 30 wherein the step of annealing is carried out at a temperature in the range of 100–300° C.

32. The process of claim 30, wherein the step of reacting the layer is carried out at temperatures of 350–600° C.

33. The process of claim 3, wherein the step of reacting the layer is carried out at temperatures of 350–600° C.

* * * * *